United States Patent
Nakada

(10) Patent No.: US 9,214,336 B2
(45) Date of Patent: Dec. 15, 2015

(54) METHOD FOR PRODUCING A GROUP III NITRIDE SEMICONDUCTOR

(71) Applicant: TOYODA GOSEI CO., LTD., Kiyosu-shi (JP)

(72) Inventor: Naoyuki Nakada, Kiyosu (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 54 days.

(21) Appl. No.: 13/955,836

(22) Filed: Jul. 31, 2013

(65) Prior Publication Data

US 2014/0087545 A1    Mar. 27, 2014

(30) Foreign Application Priority Data

Sep. 27, 2012 (JP) ................. 2012-213990
Sep. 27, 2012 (JP) ................. 2012-214017

(51) Int. Cl.
    *H01L 21/00*      (2006.01)
    *H01L 21/02*      (2006.01)
    *C23C 16/02*      (2006.01)
                (Continued)

(52) U.S. Cl.
CPC ...... *H01L 21/02365* (2013.01); *C23C 16/0218* (2013.01); *C23C 16/0272* (2013.01); *C23C 16/303* (2013.01); *H01L 21/0242* (2013.01); *H01L 21/0243* (2013.01); *H01L 21/0254* (2013.01); *H01L 21/0262* (2013.01); *H01L 21/02458* (2013.01); *H01L 21/02576* (2013.01); *H01L 21/02579* (2013.01); *H01L 21/02631* (2013.01); *H01L 21/02658* (2013.01)

(58) Field of Classification Search
CPC .............. H01L 33/007; H01L 21/0254; H01L 21/02458; H01L 33/22

USPC ............... 438/29, 4, 46, 47; 257/98
See application file for complete search history.

(56) References Cited

U.S. PATENT DOCUMENTS 4,360,167 A * 11/1982 Beccalori et al. ............ 241/274
5,316,970 A * 5/1994 Batchelder et al. .......... 250/424
(Continued)

FOREIGN PATENT DOCUMENTS

JP    2007-273659 A    10/2007
JP    2009-123717 A    6/2009
(Continued)

OTHER PUBLICATIONS

Taiwan Office Action dated May 11, 2015 with an English translation.
(Continued)

*Primary Examiner* — Mary Wilczewski
*Assistant Examiner* — Erik T Peterson
(74) *Attorney, Agent, or Firm* — McGinn IP Law Group, PLLC

(57) ABSTRACT

The surface of a sapphire substrate having a c-plane main surface is patterned by ICP dry etching. The patterned sapphire substrate is thermally treated in a hydrogen or nitrogen atmosphere at a temperature of less than 700° C. or at a temperature of more than 800° C. to 1100° C. An AlN buffer layer is formed by magnetron sputtering on the surface on the patterned side of the sapphire substrate heated at a temperature of 200° C. to less than 700° C. On the buffer layer, a Group III nitride semiconductor layer having a c-plane main surface is formed so as to have a thickness of 1 μm to 10 μm by MOCVD.

15 Claims, 6 Drawing Sheets

(51) Int. Cl.
*C23C 16/30* (2006.01)
*H01L 33/00* (2010.01)

(56) References Cited

U.S. PATENT DOCUMENTS

| | | | |
|---|---|---|---|
| 6,432,727 B1* | 8/2002 | Sonoda | 438/4 |
| 7,968,361 B2 | 6/2011 | Osawa et al. | |
| 8,492,186 B2 | 7/2013 | Shinohara et al. | |
| 8,765,509 B2 | 7/2014 | Shinoda et al. | |
| 2009/0114933 A1 | 5/2009 | Osawa et al. | |
| 2010/0025684 A1 | 2/2010 | Shinohara et al. | |
| 2010/0102360 A1* | 4/2010 | Nakada et al. | 257/201 |
| 2010/0163901 A1* | 7/2010 | Fudeta | 257/98 |
| 2012/0070966 A1* | 3/2012 | Katsumata et al. | 438/479 |
| 2012/0083063 A1 | 4/2012 | Shinoda et al. | |

FOREIGN PATENT DOCUMENTS

| | | |
|---|---|---|
| JP | 2010-010363 A | 1/2010 |
| JP | 2012-074484 A | 4/2012 |
| JP | 2012-079722 A | 4/2012 |
| WO | WO 2007/119619 A1 | 10/2007 |

OTHER PUBLICATIONS

Japanese Office Actions dated Jul. 28, 2015, with a partial English translation.

* cited by examiner

800°C

700°C

600°C

500°C

H₂ atmosphere N₂ atmosphere

H₂ annealing at 700°C after patterning

H₂ annealing at 800°C after patterning

H₂ annealing at 1160°C after patterning

Standard (without patterning and annealing)

Patterning without annealing

H₂ annealing at 500°C after patterning

1160°C

1100°C

1000°C

900°C

800°C

700°C $H_2$ atmosphere        $N_2$ atmosphere

METHOD FOR PRODUCING A GROUP III NITRIDE SEMICONDUCTOR

BACKGROUND OF THE INVENTION

1. Field of the Invention

The present invention relates to a method for forming a Group III nitride semiconductor by MOCVD after forming an AlN buffer layer on a patterned sapphire substrate by sputtering.

2. Background Art

Since the lattice constant of sapphire is significantly different from that of Group III nitride semiconductor in forming a Group III nitride semiconductor on the sapphire substrate by MOCVD, a buffer layer is formed between the sapphire substrate and the Group III nitride semiconductor to reduce the lattice mismatch, thereby improving the crystallinity of the Group III nitride semiconductor. Generally, the buffer layer is made of AlN or GaN grown by MOCVD at a low temperature, but a technique to form the buffer layer by sputtering is also known.

In the method for producing a Group III nitride semiconductor light-emitting device, the Group III nitride semiconductor layer is formed via the buffer layer on the patterned sapphire substrate, thereby improving the light extraction efficiency.

Japanese Patent Application Laid-Open (kokai) No. 2010-10363 discloses that after thermal treatment of a sapphire substrate having an a-plane main surface, which is patterned into a concave-convex figure by dry etching, in a hydrogen atmosphere at a temperature of 1000° C. to 1500° C., an AlN buffer layer is formed on the sapphire substrate having an a-plane main surface by sputtering, and a Group III nitride semiconductor is grown on the buffer layer by MOCVD. It is also disclosed that the thermal treatment under such conditions allows the growth of Group III nitride semiconductor having high crystallinity even on the sapphire substrate having an a-plane main surface damaged by dry etching.

However, the method disclosed in Japanese Patent Application Laid-Open (kokai) No. 2010-10363 requires thermal treatment process at a high temperature, and there was a problem of production cost. Since the atomic arrangement is different on between the a-plane and the c-plane of sapphire, the thermal treatment conditions to form a Group III nitride semiconductor having good surface flatness and crystallinity should be different. However, Japanese Patent Application Laid-Open (kokai) No. 2010-10363 discloses only the case where a sapphire substrate having an a-plane main surface is used. There is no description of thermal conditions about the case where a sapphire substrate having a c-plane main surface is used.

SUMMARY OF THE INVENTION

In view of the foregoing, an object of the present invention is to improve flatness and crystallinity of Group III nitride semiconductor when an AlN buffer layer is formed on a sapphire substrate having a c-plane main surface by sputtering and a Group III nitride semiconductor is formed on the buffer layer.

One aspect of the present invention is a method for producing a Group III nitride semiconductor comprising growing a Group III nitride semiconductor by MOCVD after forming an AlN buffer layer on a sapphire substrate by sputtering, wherein a sapphire substrate having a c-plane main surface and a surface patterned in a concave or convex figure by dry etching is used, and a buffer layer is formed after thermal treatment (annealing) of the sapphire substrate in a nitrogen or hydrogen atmosphere at a temperature of less than 700° C.

In the thermal treatment before the formation of the buffer layer, the temperature is more preferably from 500° C. to 700° C. Thereby, the surface flatness and crystallinity of the Group III nitride semiconductor can be further improved. The temperature is further preferably from 500° C. to 600° C.

The thermal treatment in the range of the temperature from 500° C. to 700° C. before the formation of the buffer layer is more preferably performed in a nitrogen atmosphere because the surface flatness of the Group III nitride semiconductor is more improved than in a hydrogen atmosphere.

In the present invention, the buffer layer is preferably formed by sputtering on the sapphire substrate heated from 200° C. to 700° C.

Other aspect of the present invention is a method for producing a Group III nitride semiconductor comprising growing a Group III nitride semiconductor by MOCVD after forming an AlN buffer layer on a sapphire substrate by sputtering, wherein a sapphire substrate having a c-plane main surface and a surface patterned in a concave or convex figure by dry etching is used, a buffer layer is formed by sputtering on the sapphire substrate heated at a temperature of 200° C. to less than 700° C., and the sapphire substrate is kept at a normal temperature during the period from after the formation of the buffer layer to before the formation of a Group III nitride semiconductor.

As used herein, the term "normal temperature" refers to a temperature that is obtained without heating or cooling, e.g. within a range of 0° C. to 40° C.

Another aspect of the present invention is a method for producing a Group III nitride semiconductor comprising growing a Group III nitride semiconductor by MOCVD after forming an AlN buffer layer on a sapphire substrate by sputtering, wherein a sapphire substrate having a c-plane main surface and a surface patterned in a concave or convex figure by dry etching is used, and a buffer layer is formed after the thermal treatment of the sapphire substrate in a nitrogen or hydrogen atmosphere at a temperature greater than 800° C. and not greater than 1100° C.

In the thermal treatment before the formation of the buffer layer, the temperature is more preferably from 900° C. to 1100° C. Thereby, the surface flatness and crystallinity of the Group III nitride semiconductor can be further improved. The temperature is further preferably from 900° C. to 1000° C.

The thermal treatment in the range of the temperature from 800° C. to 1100° C. before the formation of the buffer layer is preferably performed in a hydrogen atmosphere in because the surface flatness of the Group III nitride semiconductor is more improved than in a nitrogen atmosphere.

The buffer layer is preferably formed by sputtering on the sapphire substrate heated from 200° C. to 700° C.

Magnetron sputtering, DC sputtering, RF sputtering, ion beam sputtering, and ECR sputtering may be used to form a buffer layer.

The present invention is particularly effective when the area etched by dry etching is larger than the unetched area (the area protected by a mask).

According to the present invention, a Group III nitride semiconductor with good surface flatness and crystallinity can be formed via the AlN buffer layer formed by sputtering on the patterned sapphire substrate having a c-plane main surface. The production method according to the present invention does not require thermal treatment at a high temperature, thereby reducing the production cost.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

A specific embodiment of the present invention will next be described with reference to the drawings. However, the present invention is not limited to the embodiment.

Embodiment 1

Figure 1A:
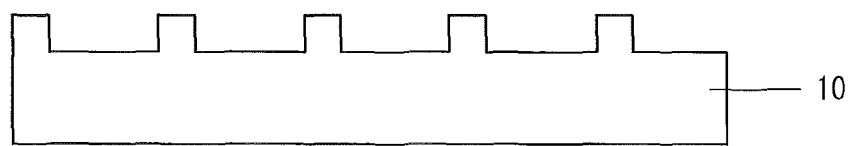
FIGS. 1A to 1C are sketches showing processes for producing the Group III nitride semiconductor according to Embodiment 1.

Firstly, a sapphire substrate 10 having a c-plane main surface was prepared. One surface of the sapphire substrate was patterned by ICP dry etching (FIG. 1A). The pattern includes a dot pattern in which concaves and convexes are periodically arranged or a stripe pattern. In the case of dot pattern, each dot has a planar shape of hexagon, rectangle, triangle, circle, and others, and a three-dimensional shape of pyramid, circular cone, prism, cylinder, truncated pyramid, circular truncated cone, and others which respectively have the above-mentioned planar shape on the top surface of the dot.

The pattern preferably has a depth (height of dot pattern convex, depth of dot pattern concave, or depth of stripe groove) of 0.1 μm to 10 μm. When the depth is less than 0.1 μm, the light extraction efficiency is not sufficiently improved in the light emitting device according to the present invention. When the depth exceeds 10 μm, the pattern of the Group III nitride semiconductor formed on the sapphire substrate 10 is incompletely filled in, and thus a flat Group III nitride semiconductor cannot be obtained, which is not preferable.

Subsequently, the patterned sapphire substrate 10 was subjected to thermal treatment in a hydrogen or nitrogen atmosphere at a temperature of less than 700° C. The pressure was normal. In the thermal treatment, heating was stopped to lower the temperature to a normal temperature immediately after heating to a designated temperature. The thermal treatment may be performed using a magnetron sputter used in the next process or other device. The lower limit of the thermal treatment temperature is a normal temperature.

Figure 1B:
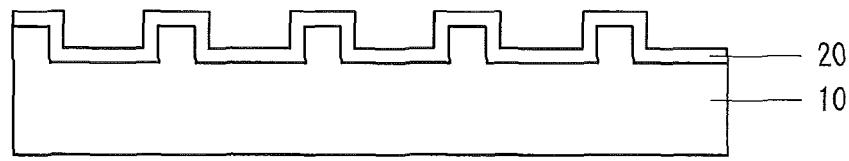

Next, the patterned sapphire substrate 10 was placed in a chamber of the magnetron sputtering apparatus. With the sapphire substrate 10 heated at any temperature in a range from 200° C. to less than 700° C., an AlN buffer layer 20 was formed on the patterned surface of the sapphire substrate 10 by the magnetron sputter (FIG. 1B). AlN was deposited by using a high-purity metallic aluminum target and introducing a nitrogen gas in the chamber of the magnetron sputtering apparatus.

DC sputtering, RF sputtering, ion beam sputtering, and ECR sputtering other than magnetron sputtering may be used to form the buffer layer 20.

Figure 1C:
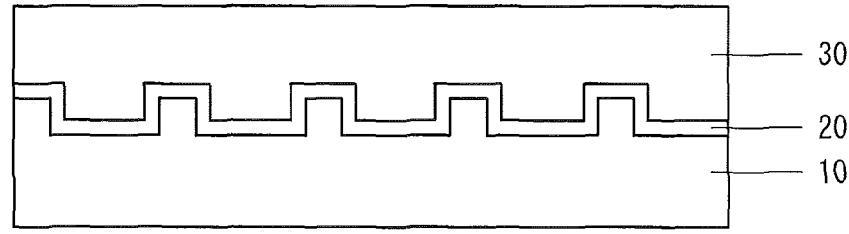

Subsequently, the sapphire substrate 10 was taken out from the chamber of the sputtering apparatus and placed in a MOCVD equipment, and a Group III nitride semiconductor layer 30 having a c-plane main surface was grown so as to have a thickness of 1 μm to 10 μm on the buffer layer 20 by MOCVD (FIG. 1C). The raw material gases employed for MOCVD were as follows: ammonia ($NH_3$) as a nitrogen source; trimethylgallium ($Ga(CH_3)_3$) as a Ga source; trimethylindium ($In(CH_3)_3$) as an In source; trimethylaluminum ($Al(CH_3)_3$) as an Al source; silane ($SiH_4$) as a Si dopant gas; biscyclopentadienylmagnesium ($Mg(C_5H_5)_2$) as a Mg dopant gas, and hydrogen ($H_2$) or nitrogen ($N_2$) as a carrier gas. When the present invention is applied to a method for producing a light-emitting device, the Group III nitride semiconductor layer 30 comprises an n-type layer, a light-emitting layer, and a p-type layer which are deposited in this order.

This is the method for producing the Group III nitride semiconductor according to Embodiment 1. In this production method, thermal treatment is performed under the above temperature conditions before the formation of the buffer layer 20 after the sapphire substrate 10 was patterned. Therefore, even if the patterned sapphire substrate having a c-plane main surface 10 is used, the Group III nitride semiconductor layer 30 with good surface flatness and crystallinity can be formed via the buffer layer 20 on the sapphire substrate 10. Moreover, in the method for producing the Group III nitride semiconductor according to Embodiment 1, thermal treatment is performed at a comparatively low temperature of less than 700° C., and thermal treatment at a high temperature is not required, thereby reducing the production cost.

The method for producing the Group III nitride semiconductor according to Embodiment 1 is particularly effective when the sapphire substrate 10 is patterned such that the surface area etched by dry etching of the sapphire substrate 10 is larger than the unetched area protected by a mask. In the case of such pattern, the Group III nitride semiconductor is largely grown on a portion damaged by dry etching. But conventionally, the Group III nitride semiconductor layer 30 with good crystallinity could not be formed. However, even in the case of such pattern, the Group III nitride semiconductor layer 30 with good crystallinity can be obtained by employing the present invention.

In the thermal treatment before the formation of the buffer layer 20, the temperature is more preferably from 500° C. to less than 700° C. because the surface flatness and crystallinity of the Group III nitride semiconductor layer 30 can be further improved. Further preferably, the temperature is from 500° C. to 600° C. Thermal treatment is preferably performed in a nitrogen atmosphere than in a hydrogen atmosphere because the surface flatness of the Group III nitride semiconductor layer 30 is further improved.

Embodiment 2

A method for producing the Group III nitride semiconductor according to Embodiment 2 is the same as the production method according to Embodiment 1 except that thermal treatment is not performed before the formation of the buffer layer 20. That is, while the temperature is kept at a normal temperature without performing thermal treatment after the sapphire substrate 10 was patterned, the AlN buffer layer 20 is formed by magnetron sputtering.

The method for producing the Group III nitride semiconductor according to Embodiment 2 also allows the formation of Group III nitride semiconductor layer 30 having good surface flatness and crystallinity, similar to the case of the production method according to Embodiment 1. Moreover, since thermal treatment is not performed, the production process can be simplified and the production cost can be reduced. This is because the sapphire substrate 10 is heated by the magnetron sputtering, which substitutes for thermal treatment before the formation of the buffer layer 20. Thus, the temperature of the sapphire substrate 10 in forming the buffer layer 20 by magnetron sputtering is more preferably from 500° C. to less than 700° C., and further preferably from 500° C. to 600° C.

In Embodiments 1 and 2, during the period from the time when the sapphire substrate 10 is taken out from the sputtering apparatus, to the time when it is placed in the MOCVD equipment, removing electricity from the buffer layer 20 (electrically neutralizing the buffer layer 20) is preferable. This is because the buffer layer 20 formed by sputtering is electrically charged and exposed to an atmosphere when the sapphire substrate 10 is transferred from the sputtering apparatus to the MOCVD equipment, and as a result, fine dusts stick to the buffer layer 20, which affect the crystallinity of Group III nitride semiconductor layer 30. Therefore, electric neutralization of the buffer layer 20 can prevent fine dusts from sticking, and improve the crystallinity of the Group III nitride semiconductor layer 30. Electrical neutralization is performed, for example, by supplying the air ionized by an ionizer onto the surface of the buffer layer 20.

Embodiment 3

Figure 6A:
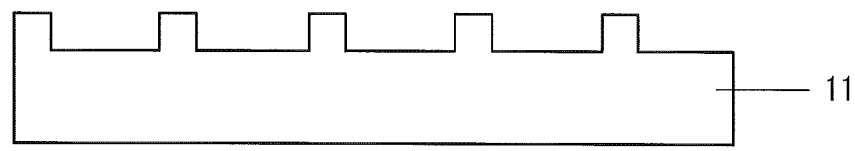
FIGS. 6A to 6C are sketches showing processes for producing the Group III nitride semiconductor according to Embodiment 3.

As shown in FIG. 6A, a sapphire substrate 11 having a c-plane main surface was prepared. One surface of the sapphire substrate was patterned by ICP dry etching to have a periodical concave and convex pattern. The shape, size and concave depth of pattern are the same as those according to Embodiment 1.

Subsequently, the patterned sapphire substrate 11 was subjected to thermal treatment in a hydrogen or nitrogen atmosphere at a temperature of more than 800° C. to 1100° C. The pressure was normal. In the thermal treatment, heating was stopped to lower the temperature to a normal temperature immediately after heating to a designated temperature. The thermal treatment may be performed using a magnetron sputtering apparatus used in the next process or other device.

Figure 6B:
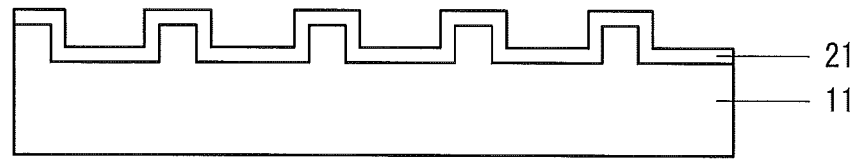

Next, the patterned sapphire substrate 11 was placed in a chamber of the magnetron sputtering apparatus. With the sapphire substrate 11 heated from 200° C. to less than 700° C., an AlN buffer layer 21 was formed on the patterned surface of the sapphire substrate 11 by the magnetron sputter (FIG. 6B). The conditions for forming the buffer layer were the same as those according to Embodiment 1.

In the present Embodiment as well as in Embodiments 1 and 2, DC sputtering, RF sputtering, ion beam sputtering and ECR sputtering other than magnetron sputtering may be used to form the buffer layer 21.

Figure 6C:
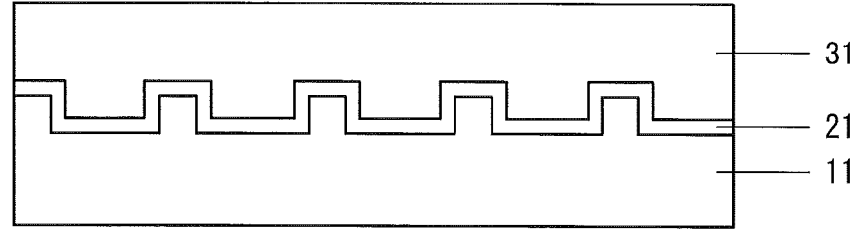

Subsequently, the sapphire substrate 11 was taken out from the chamber of the sputtering apparatus and placed in a MOCVD equipment, and a Group III nitride semiconductor layer 31 having a c-plane main surface was grown so as to have a thickness of 1 μm to 10 μm on the buffer layer 21 by MOCVD (FIG. 6C). The raw material gases employed and growth conditions for MOCVD were the same as those according to Embodiment 1.

This is the method for producing the Group III nitride semiconductor according to Embodiment 3. In this production method, thermal treatment is performed in a hydrogen or nitrogen atmosphere, at a temperature of more than 800° C. to 1100° C. before the formation of the buffer layer 21 after the sapphire substrate 11 was patterned. Therefore, even if the patterned sapphire substrate having a c-plane main surface 11 is used, the Group III nitride semiconductor layer 31 having with good surface flatness and crystallinity can be formed via the buffer layer 21 on the sapphire substrate 11.

The method for producing the Group III nitride semiconductor according to Embodiment 3 is particularly effective when the sapphire substrate 11 is patterned such that the surface area etched by dry etching of the sapphire substrate 11 is larger than the unetched area protected by a mask. In the case of such pattern, the Group III nitride semiconductor is largely grown on a portion damaged by dry etching. But conventionally, the Group III nitride semiconductor layer 31 with good crystallinity could not be formed. However, even in the case of such pattern, the Group III nitride semiconductor layer 31 with good crystallinity can be obtained by employing the present invention.

In the thermal treatment before the formation of the buffer layer 21, the temperature is more preferably from 900° C. to 1100° C. because the surface flatness and crystallinity of the Group III nitride semiconductor layer 31 can be further improved. Further preferably, the temperature is from 900° C. to 1000° C. Thermal treatment is preferably performed in a hydrogen atmosphere than in a nitrogen atmosphere because the surface flatness of the Group III nitride semiconductor layer 31 is further improved.

During the period from the time when the sapphire substrate 11 is taken out from the sputtering apparatus, to the time when it is placed in the MOCVD equipment, removing electricity from the buffer layer 21 (electrically neutralizing the buffer layer 21) is preferable. This is because the buffer layer 21 formed by sputtering is electrically charged and exposed to an atmosphere when the sapphire substrate 11 is transferred from the sputtering apparatus to the MOCVD equipment, and as a result, fine dusts stick to the buffer layer 21, which affect the crystallinity of Group III nitride semiconductor layer 31. Therefore, electric neutralization of the buffer layer 21 can prevent fine dusts from sticking, and improve the crystallinity of the Group III nitride semiconductor layer 31. Electrical neutralization is performed, for example, by supplying the air ionized by an ionizer onto the surface of the buffer layer 21.

EXPERIMENTAL EXAMPLES

Next will be described Experimental Examples supporting Embodiments 1, 2, and 3.

Figure 2:
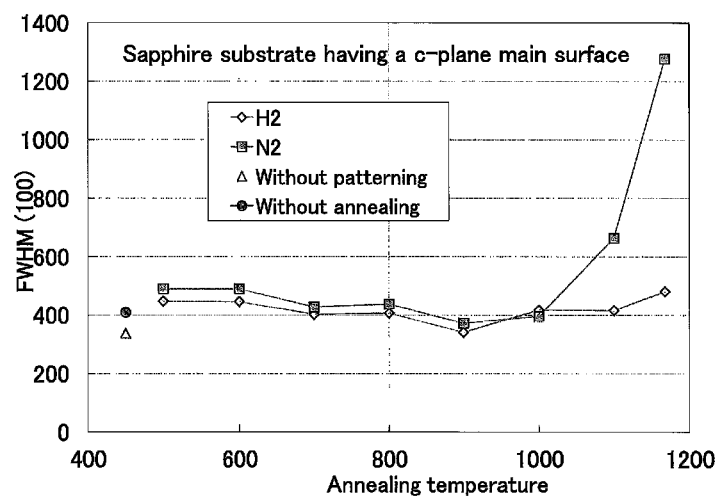
FIG. 2 is a graph showing a relationship between thermal treatment temperature and crystallinity.
Figure 3:
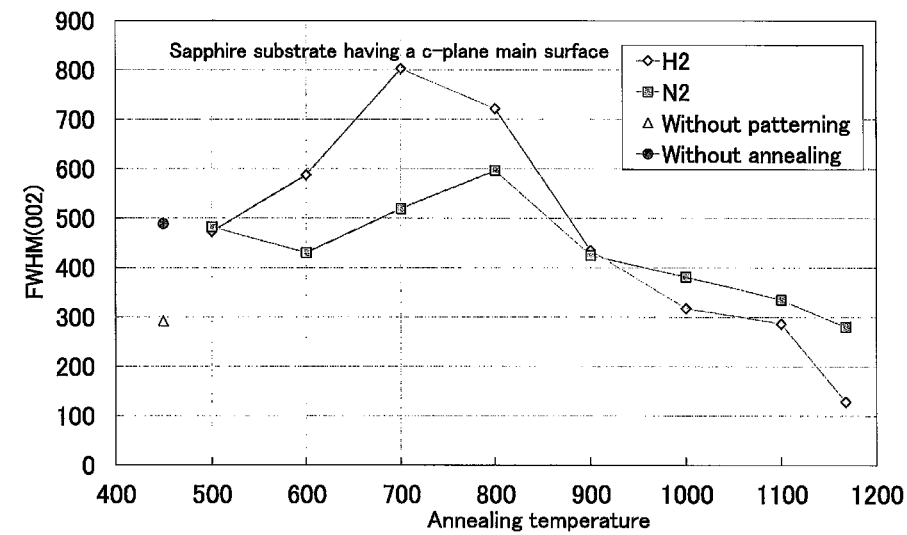
FIG. 3 is a graph showing a relationship between thermal treatment temperature and crystallinity.

FIGS. 2 and 3 are graphs showing a relationship between the temperature of thermal treatment performed before the formation of the buffer layers 20 and 21 and the crystallinity of the Group III nitride semiconductor layers 30 and 31. The crystallinity was evaluated by the X-ray rocking curve (XRC) measurements. FIG. 2 shows the XRC full width at half maximum values for (10-10) plane ((100) plane when represented by three indices), and FIG. 3 shows the XRC full width at half maximum values for (0002) plane ((002) plane when represented by three indices). The XRC full width at half maximum was measured respectively when thermal treatment is performed in a hydrogen atmosphere and when thermal treatment is performed in a nitrogen atmosphere. The Group III nitride semiconductor layers 30 and 31 were an undoped GaN layer having a thickness of 3 μm. The entire surface of the sapphire substrates 10 and 11 were patterned by ICP dry etching. The sapphire substrates 10 and 11 were heated at a temperature of 450° C. when forming the buffer layer 20 and 21. For comparison, the XRC full width at half maximum (as shown by the mark "●") was measured when thermal treatment is not performed before the formation of the buffer layers 20 and 21 (corresponding to Embodiment 2). And the XRC full width at half maximum (as shown by the mark "Δ") was measured when the surface of the sapphire substrates 10 and 11 is not dry etched and thermal treatment is not performed. It can be evaluated that the closer to the target crystallinity in the case when both dry etching and thermal treatment are not performed, the better the crystallinity.

As is clear from FIG. 2, the XRC full width at half maximum for the GaN (10-10) plane is small both in a hydrogen atmosphere and in a nitrogen atmosphere in a thermal treatment temperature range of 500° C. to 1100° C., resulting in good crystallinity. The crystallinity is almost the same as when thermal treatment is not performed for the sapphire substrates 10 and 11 and slightly lower than when both dry etching and thermal treatment are not performed. However, at a temperature in a range of 700° C. to 800° C., pits were observed on GaN. At a temperature of more than 1100° C., the XRC full width at half maximum increased in a nitrogen atmosphere, resulting in deterioration of crystallinity. It was observed that in a hydrogen atmosphere, the XRC full width at half maximum slightly increased at a temperature of more than 1100° C.

As is clear from FIG. 3, the XRC full width at half maximum for the GaN (0002) plane when thermal treatment was performed in a hydrogen atmosphere had a characteristic of gradually increasing in a temperature range of 500° C. to 700° C., and decreasing in a temperature range of 800° C. or more. At a temperature from 700° C. to 800° C., the full width at half maximum was large, the GaN (0002) plane exhibited low crystallinity. On the other hand, when thermal treatment was performed in a nitrogen atmosphere, the XRC full width at half maximum had a characteristic of being almost constant up to 700° C., increasing at a temperature of more than 700° C., and decreasing in a temperature range of 800° C. or more. As is in a hydrogen atmosphere, at a temperature of more than 700° C. and less than 800° C., the XRC full width at half maximum was large, resulting in low crystallinity. In a temperature range of 500° C. to 900° C., the XRC full width at half maximum was smaller in a nitrogen atmosphere than in a hydrogen atmosphere, and in a temperature range of 900° C. or more, the XRC full width at half maximum was smaller in a hydrogen atmosphere than in a nitrogen atmosphere. When thermal treatment was not performed, the XRC full width at half maximum was equal to that when thermal treatment was performed in a nitrogen atmosphere in a temperature range from 500° C. to 700° C. When both dry etching and thermal treatment were not performed for the sapphire substrates 10 and 11, the XRC full width at half maximum was lower by 200 arc sec than when thermal treatment was performed in a nitrogen atmosphere at a temperature of 500° C. to 700° C.

Figure 4A:
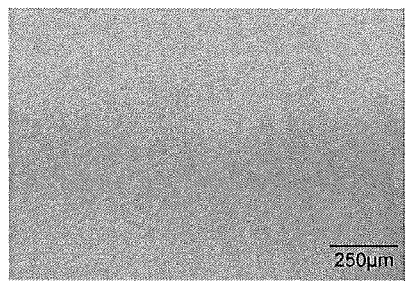
FIGS. 4A to 4I are photos of GaN surface.
Figure 4B:
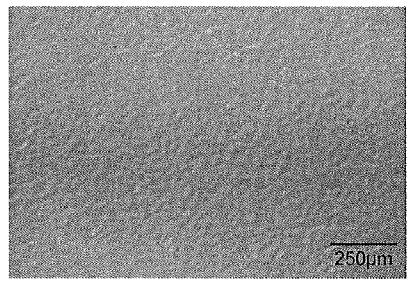
Figure 4F:
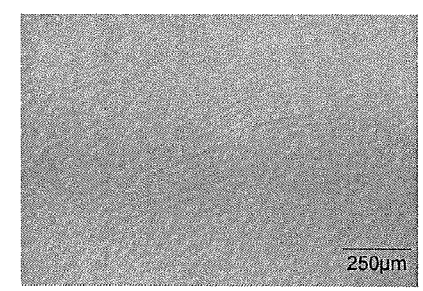
Figure 4C:
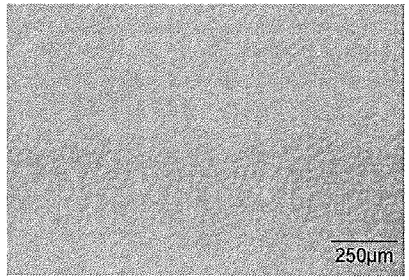
Figure 4G:
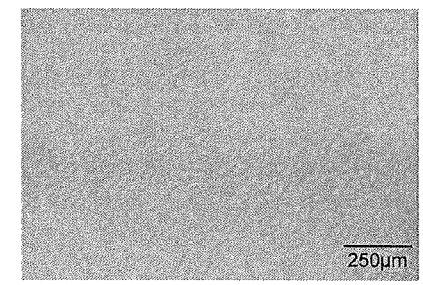
Figure 4D:
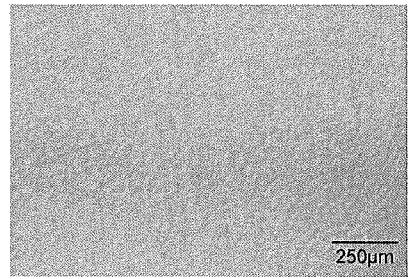
Figure 4H:
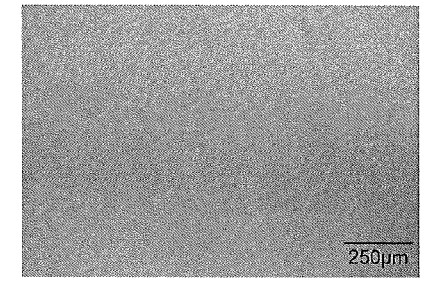
Figure 4E:
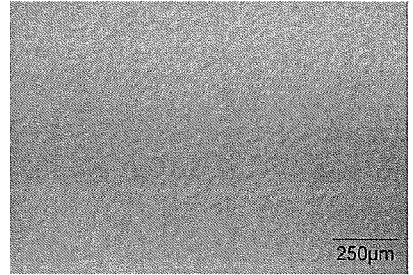
Figure 4I:
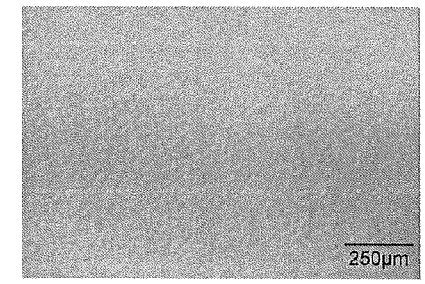

FIGS. 4A to 4I and 7A to 7M are photos taken of the surface of GaN formed in the experiments of FIGS. 2 and 3. FIG. 4A shows the case when thermal treatment was not performed, and FIGS. 4B to 4E show the cases when thermal treatment was performed in a hydrogen atmosphere at a temperature of 800° C., 700° C., 600° C., and 500° C. respectively. FIGS. 4F to 4I show the cases when thermal treatment was performed in a nitrogen atmosphere at a temperature of 800° C., 700° C., 600° C., and 500° C. respectively. As is clear from FIGS. 4A to 4I, the surface flatness of GaN is higher when the thermal treatment temperature was 500° C. or 600° C. than when the thermal treatment temperature was 700° C. or 800° C., either in a hydrogen atmosphere or in a nitrogen atmosphere. When the thermal treatment temperature was 700° C. or 800° C., pits were observed. Even when thermal treatment was not performed, the GaN surface was as flat as when thermal treatment was performed at a temperature of 500° C. or 600° C.

Figure 7A:
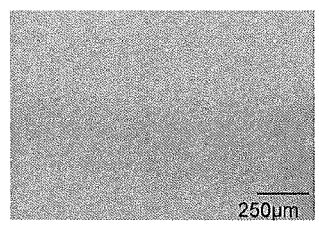
FIGS. 7A to 7M are photos of GaN surface.
Figure 7B:
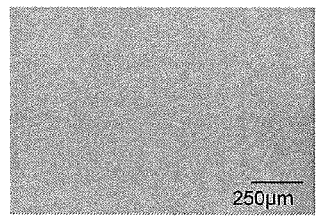
Figure 7H:
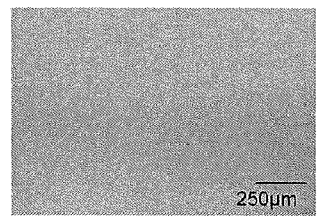
Figure 7C:
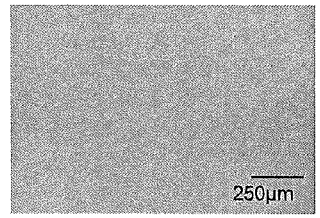
Figure 7I:
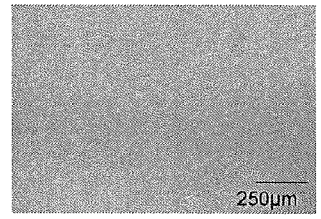
Figure 7D:
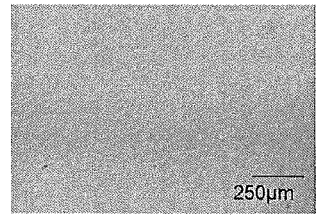
Figure 7J:
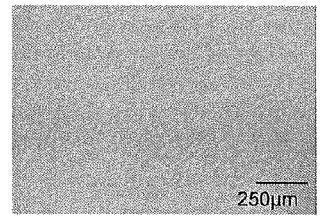
Figure 7E:
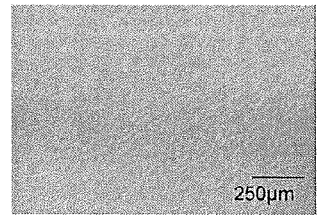
Figure 7K:
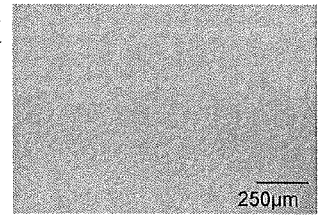
Figure 7F:
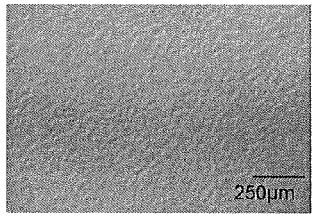
Figure 7L:
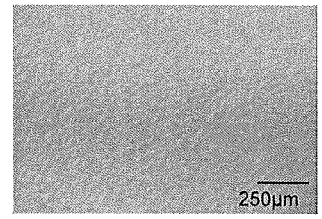
Figure 7G:
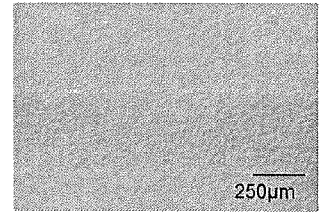
Figure 7M:
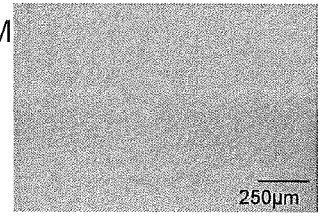

FIGS. 7A to 7M are also photos taken of the surface of GaN formed in the experiments of FIGS. 2 and 3. FIG. 7A shows the case when thermal treatment was not performed, and FIGS. 7B to 7G show the cases when thermal treatment was performed in a hydrogen atmosphere at a temperature of 1160° C., 1100° C., 1000° C., 900° C., 800° C., and 700° C. respectively. FIGS. 7H to 7M show the cases when thermal treatment was performed in a nitrogen atmosphere at a temperature of 1160° C., 1100° C., 1000° C., 900° C., 800° C., and 700° C. respectively. As is clear from FIGS. 7A to 7M, the surface flatness of GaN is higher when the thermal treatment temperature was 1160° C., 1100° C., 1000° C., or 900° C. than when the thermal treatment temperature was 700° C. or 800° C., either in a hydrogen atmosphere or in a nitrogen atmosphere. When the thermal treatment temperature was 700° C. or 800° C., pits were observed.

It was found from FIGS. 2 to 4 that GaN having excellent surface flatness and crystallinity can be obtained if thermal treatment is performed at a temperature of less than 700° C. in a hydrogen atmosphere or in a nitrogen atmosphere. It was also found that GaN having excellent surface flatness and crystallinity can be obtained even if thermal treatment is not performed.

It was found from FIGS. 2, 3 and 7 that GaN having excellent surface flatness and crystallinity can be obtained if thermal treatment is performed in a hydrogen atmosphere or in a nitrogen atmosphere at a temperature of more than 800° C. to 1100° C. It was also found that when the thermal treatment temperature was from 900° C. to 1100° C., crystallinity can be further improved.

FIGS. 5A to 5F are photos of RHEED (Reflection High Energy Electron Diffraction) pattern of the sapphire substrates 10 and 11 after thermal treatment. The sapphire substrates 10 and 11 have a c-plane main surface, and the entire surface is patterned by ICP dry etching as in the case of FIGS. 2 to 4. For comparison, the RHEED pattern was photographed in the case when both dry etching and thermal treatment were not performed, and in the case when only dry etching was performed and thermal treatment was not performed. Thermal treatment was performed in a hydrogen atmosphere at a temperature of 500° C., 700° C., 800° C., and 1160° C. Moreover, the electron beam was incident in two directions: [11-20] direction and [10-10] direction of the sapphire substrates 10 and 11 having a c-plane main surface.

Figure 5D:
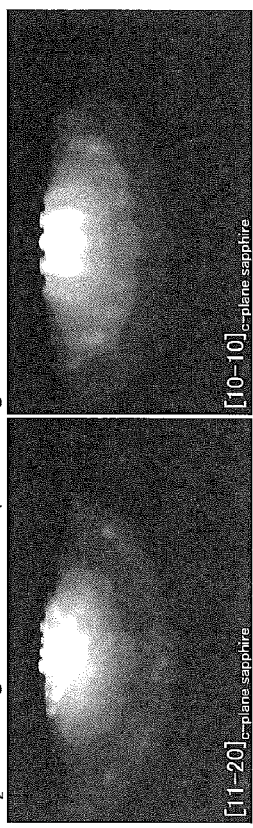
FIGS. 5A to 5F are photos of sapphire substrate RHEED pattern.
Figure 5E:
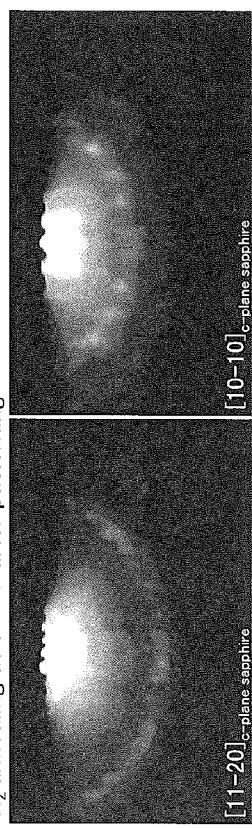
Figure 5F:
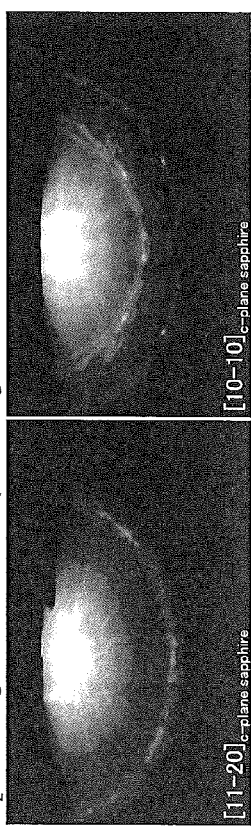
Figure 5A:
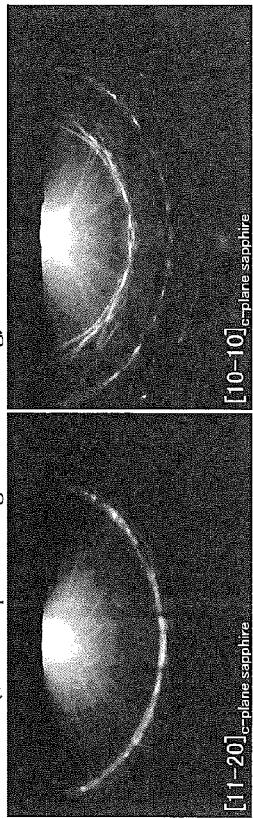
Figure 5B:
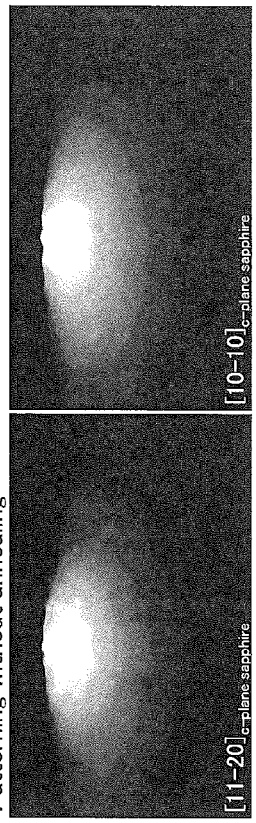
Figure 5C:
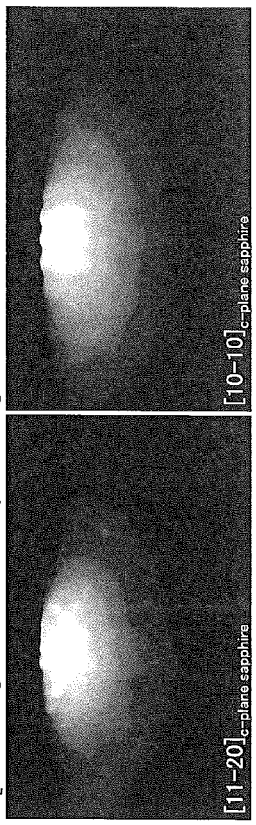

When both dry etching and thermal treatment were not performed as in FIG. 5A, the sapphire substrates 10 and 11 have no surface roughness due to dry etching, thereby obtaining clear pattern. On the contrary, when thermal treatment was not performed after dry etching as in FIG. 5B, the pattern was blurred, and the surface roughness was observed. As is clear from FIGS. 5C to 5F, the higher the thermal treatment temperature, the clearer the pattern, and the surface roughness is gradually recovered.

The reason for low surface flatness and crystallinity of GaN at the thermal treatment temperature of 700° C. to 800° C. can be inferred as follows from the experiment results of FIGS. 2 to 5. When the thermal treatment temperature is less than 700° C., the surface roughness of the sapphire substrates 10 and 11 is almost even, GaN is also grown uniformly on the rough surface of the sapphire substrates 10 and 11, resulting in excellent surface flatness and crystallinity of GaN. When the thermal treatment temperature is more than 800° C., the surface roughness of the sapphire substrates 10 and 11 is sufficiently recovered, and GaN is uniformly grown on the recovered surface, resulting in excellent surface flatness and crystallinity. However, when the thermal treatment temperature is from 700° C. to 800° C., the surface roughness of the sapphire substrates 10 and 11 is slightly recovered but not uniformly recovered, and thus the recovered portion and the unrecovered portion are mixed. Therefore, GaN is grown on both the recovered portion and the unrecovered portion, which are mixed into a crystal, thereby deteriorating the surface flatness or crystallinity of GaN.

What is claimed is:

1. A method for producing a Group III nitride semiconductor comprising:
    growing the Group III nitride semiconductor by MOCVD after forming an MN buffer layer on a sapphire substrate by sputtering, the sapphire substrate having an etched surface of a c-plane main surface which is patterned in a concave or convex figure by dry etching; and
    performing thermal treatment on the etched surface of the sapphire substrate which is exposed in at least one selected from a nitrogen atmosphere and a hydrogen atmosphere at a thermal treatment temperature in a range of 500° C. to less than 700° C.;
    lowering a temperature of the sapphire substrate to a temperature in a range from 0° C. to 40° C. after heating to the thermal treatment temperature and finishing the thermal treatment of the sapphire substrate;
    after the lowering of the temperature, increasing the temperature of the sapphire substrate with the exposed and etched surface to a sputtering temperature in a range of 200° C. to less than 700° C. for forming the buffer layer; and
    after the increasing of the temperature, forming the buffer layer on the exposed and etched surface of the sapphire substrate on which the thermal treatment is finished, by sputtering while keeping the temperature of the sapphire substrate at the sputtering temperature.

2. The method for producing the Group III nitride semiconductor according to claim 1, wherein the thermal treatment temperature is in a range of 500° C. to 600° C.

3. The method for producing the Group III nitride semiconductor according to claim 2, wherein the thermal treatment is performed in a nitrogen atmosphere.

4. The method for producing the Group III nitride semiconductor according to claim 2, wherein the buffer layer is electrically neutralized after the forming of the buffer layer and before the growing of the Group III nitride semiconductor on the buffer layer.

5. The method for producing the Group III nitride semiconductor according to claim 1, wherein the thermal treatment is performed in a nitrogen atmosphere.

6. The method for producing the Group III nitride semiconductor according to claim 5, wherein the buffer layer is electrically neutralized after the forming of the buffer layer and before the growing of the Group III nitride semiconductor on the buffer layer.

7. The method for producing the Group III nitride semiconductor according to claim 1, wherein the buffer layer is electrically neutralized after the forming of the buffer layer and before the growing of the Group III nitride semiconductor on the buffer layer.

8. A method for producing a Group III nitride semiconductor comprising:
    growing the Group III nitride semiconductor by MOCVD after forming an MN buffer layer on a sapphire substrate by sputtering, the sapphire substrate having an etched surface of a c-plane main surface which is patterned in a concave or convex figure by dry etching; and
    performing thermal treatment on the etched surface of the sapphire substrate which is exposed in at least one selected from a nitrogen atmosphere and a hydrogen atmosphere at a thermal treatment temperature in a range of not less than 900° C. and less than 1100° C.;
    lowering a temperature of the sapphire substrate to a temperature in a range from 0° C. to 40° C. after heating to the thermal treatment temperature and finishing the thermal treatment of the sapphire substrate;
    after the lowering of the temperature, increasing the temperature of the sapphire substrate with the exposed and etched surface to a sputtering temperature in a range of 200° C. to less than 700° C. for forming the buffer layer; and
    after the increasing of the temperature, forming the buffer layer on the exposed and etched surface of the sapphire substrate on which the thermal treatment is finished, by sputtering while keeping the temperature of the sapphire substrate at the sputtering temperature.

9. The method for producing the Group III nitride semiconductor according to claim 8, wherein the thermal treatment temperature is in a range of not less than 1000° C. and less than 1100° C.

10. The method for producing the Group III nitride semiconductor according to claim 9, wherein the thermal treatment is performed in a hydrogen atmosphere.

11. The method for producing the Group III nitride semiconductor according to claim 10, wherein the buffer layer is electrically neutralized after the forming of the buffer layer and before the growing of the Group III nitride semiconductor on the buffer layer.

12. The method for producing the Group III nitride semiconductor according to claim 9, wherein the buffer layer is electrically neutralized after the forming of the buffer layer and before the growing of the Group III nitride semiconductor on the buffer layer.

13. The method for producing the Group III nitride semiconductor according to claim 8, wherein the thermal treatment is performed in a hydrogen atmosphere.

14. The method for producing the Group III nitride semiconductor according to claim 13, wherein the buffer layer is electrically neutralized after the forming of the buffer layer and before the growing of the Group III nitride semiconductor on the buffer layer.

15. The method for producing the Group III nitride semiconductor according to claim 8, wherein the buffer layer is electrically neutralized after the forming of the buffer layer and before the growing of the Group III nitride semiconductor on the buffer layer.

* * * * *

UNITED STATES PATENT AND TRADEMARK OFFICE
CERTIFICATE OF CORRECTION

| | | |
|---|---|---|
| PATENT NO. | : 9,214,336 B2 | Page 1 of 1 |
| APPLICATION NO. | : 13/955836 | |
| DATED | : December 15, 2015 | |
| INVENTOR(S) | : Naoyuki Nakada | |

It is certified that error appears in the above-identified patent and that said Letters Patent is hereby corrected as shown below:

Claims

In column 9, line 16, Claim 1 please replace --"after forming an MN buffer layer on a sapphire substrate"-- with --"after forming an AlN buffer layer on a sapphire substrate"--

In column 10, line 7, Claim 8 please replace --"after forming an MN buffer layer on a sapphire substrate"-- with --"after forming an AlN buffer layer on a sapphire substrate"--

Signed and Sealed this
Fifteenth Day of March, 2016

Michelle K. Lee
*Director of the United States Patent and Trademark Office*